United States Patent [19]

Fong-Chun et al.

[11] Patent Number: 5,504,025
[45] Date of Patent: Apr. 2, 1996

[54] METHOD OF FABRICATING A READ-ONLY MEMORY CELL CONFIGURATION HAVING STEEP TRENCHES

[75] Inventors: Lee Fong-Chun; Fu Chien-Chih; Wang N. Chueh, all of Hsinchu, Taiwan

[73] Assignee: United Microelectronics Corp., Hsinchu, Taiwan

[21] Appl. No.: 345,125

[22] Filed: Nov. 28, 1994

Related U.S. Application Data

[62] Division of Ser. No. 245,666, May 18, 1994, Pat. No. 5,453,637.

[51] Int. Cl.$^6$ .................................................. H01L 21/265
[52] U.S. Cl. ............................... 437/48; 437/45; 437/52
[58] Field of Search ................................. 437/48, 203, 45, 437/52; 156/649

[56] References Cited

U.S. PATENT DOCUMENTS

| | | | |
|---|---|---|---|
| 5,119,165 | 6/1992 | Ando | 257/757 |
| 5,300,804 | 4/1994 | Arai | 257/332 |

FOREIGN PATENT DOCUMENTS

| | | | |
|---|---|---|---|
| 4-226071 | 8/1992 | Japan | 257/390 |

Primary Examiner—Mary Wilczewski
Assistant Examiner—H. Jey Tsai
Attorney, Agent, or Firm—Ladas & Parry

[57] ABSTRACT

A semiconductor integrated circuit of a read-only memory device having steep trenches is disclosed. The memory device includes a substrate that has a plurality of interwoven chessboard-like trenches, each trench including opposing and sloping side walls. The memory device also includes a plurality of drain/source regions formed on the substrate. Neighboring drain/source regions are positioned, in conformity with the presence of mesas and bottoms of the trenches, in a high and low interwoven manner in a first direction along the plane of the substrate at an altitude relative to the plane of the substrate, thereby forming a generally vertical drain/source channel between each pair of neighboring drain/source regions. The memory device further includes a gate oxide layer formed on the substrate, and a plurality of gate regions formed on the surface of the gate oxide layer. Neighboring gate regions are positioned, in conformity with the presence of mesas and bottoms of the trenches, in a high and low interwoven manner in a second direction along the plane of the substrate at an altitude relative to the plane of the substrate, wherein the second direction is orthogonal to the first direction.

9 Claims, 3 Drawing Sheets

METHOD OF FABRICATING A READ-ONLY MEMORY CELL CONFIGURATION HAVING STEEP TRENCHES

This is a divisional of application Ser. No. 08/245,666 filed May 18, 1994, U.S. Pat. No. 5,453,637.

BACKGROUND OF THE INVENTION

1. Field of the Invention

The present invention relates in general to the structural configuration of read-only memories (ROM). In particular, this invention relates to the structural configuration of read-only memories having steep trenches and the method of fabricating the same.

2. Technical Background

Read-only memories are widely utilized in digital electronics applications. For example, computer systems including microcomputers and minicomputers use read-only memories for storing fixed software/firmware routines. A read-only memory (ROM) is a fixed, non-volatile memory. Normally, a ROM's memory cells are pre-programmed with specific data at the ROM's manufacturing facility before the ROM is delivered to a customer. The fabrication process for ROM devices is complicated and requires sophisticated processing steps, each of which consumes precious manufacturing time for materials processing and for adjustment of the manufacturing conditions.

The manufacturing process steps for most compatible ROM devices are virtually the same, up to the stage where each ROM is programmed with its respective memory content. Thus, it is possible to manufacture ROM devices to a semifinished stage and store them until they are to be programmed with designated memory contents or data and then promptly delivered to customers upon request. Such "post-programmed" mask ROMs are commonly employed in the art of ROM manufacturing.

Semiconductor device manufacturers strive to reduce the die area of such ROM devices to decrease the manufacturing costs and enhance their competitiveness in the ROM market. However, one configurational constraint associated with conventional ROM devices is the fact that the polysilicon gate regions of a semiconductor ROM device are normally fabricated on the same plane, with such a plane being subject to the spacing limitations imposed by the resolution of the photolithographic process which is used. This resolution restriction makes it difficult to reduce the device die size because spacing between the polysilicon gate regions cannot be reduced effectively. As may be readily appreciated, a semiconductor device occupying a larger die area than desired results in higher manufacturing costs for that particular device.

The construction of a conventional ROM device is illustrated in FIGS. 1a to 1c. The top view presented in FIG. 1a shows a ROM semiconductor device constructed on a substrate 10 (see FIG. 1b or 1c) which may be of, for example, P⁻ type material. As is better shown in FIGS. 1b and 1c, a plurality of drain/source regions 12 (of, for example, N⁺ type material), a gate oxide layer 14, and a plurality of polysilicon gate regions 16 are subsequently formed on the substrate 10.

It should be noted that in the description of this patent, the term "drain/source region" refers to either a drain region or to a source region of the device. Whether the region is a drain or a source is determined by how the device is connected to external metal lines.

In FIG. 1a, a prior art memory cell transistor is outlined generally by dotted-line 18. Such a conventional ROM device configuration must be processed by photoresist masking and ion implantation procedures as shown in FIG. 1c when its memory is to be programmed. First, a photoresist layer 20 is applied and patterned to expose the designated memory cells that will be permanently turned off when programmed. An ion implantation procedure is then conducted to turn off channel 22 permanently in those cells. With the conventional ROM device configuration, the polysilicon gate regions 16 (of the ROM memory cells) are on the same plane of the semiconductor structure. Hence, the miniaturization of semiconductor die size is limited by spacing requirements.

Moreover, the channel 22 also occupies significant semiconductor die surface area of the planar configuration memory cell transistor 18 because the drain/source regions are on the same plane.

SUMMARY OF THE INVENTION

It is therefore an object of the present invention to provide a memory cell configuration for read-only memory semiconductor devices for increasing the number of memory cells per semiconductor surface area unit by interweaving steep trenches to construct vertically configured transistor units for the device, thereby reducing the surface area each transistor unit occupies.

It is another object of the present invention to provide a memory cell configuration for read-only memory semiconductor devices for increasing the number of memory cells per semiconductor surface area unit by constructing twisted drain/source regions for the device, thereby reducing the spacing required between the regions.

It is still another object of the present invention to provide a method for fabricating the memory cell configuration for read-only memory semiconductor devices for increasing the number of memory cells per semiconductor surface area unit.

BRIEF DESCRIPTION OF THE DRAWINGS

Other objects, features and advantages of the present invention will become apparent by way of the following detailed description of the preferred but non-limiting embodiment, with reference to the accompanied drawings, wherein:

FIG. 1b is a cross-sectional front view of the memory cell configuration of the prior art read-only memory device of FIG. 1a;

FIG. 1c is a cross-sectional side view of the memory cell configuration of the prior art read-only memory device of FIG. 1a;

DETAILED DESCRIPTION OF THE PREFERRED EMBODIMENT

FIGS. 2, 3, 4a and 4b illustrate a preferred embodiment of the memory cell configuration of a read-only memory device in accordance with the present invention. Such a device may be fabricated as described below.

Figure 1A:
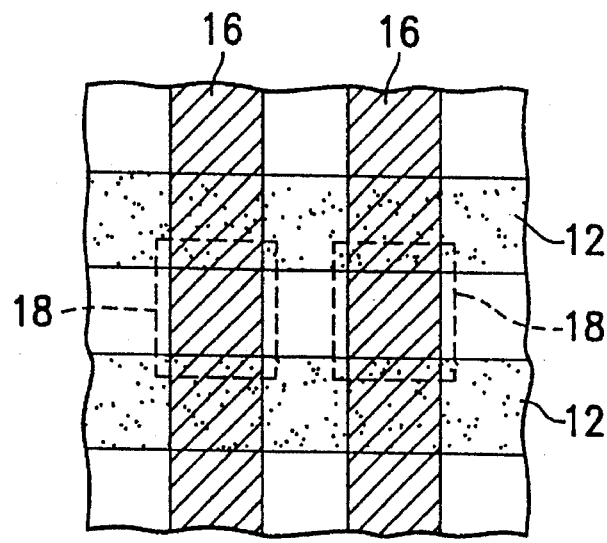
FIG. 1a is a top view of the memory cell configuration of a prior art read-only memory device.
Figure 1B:
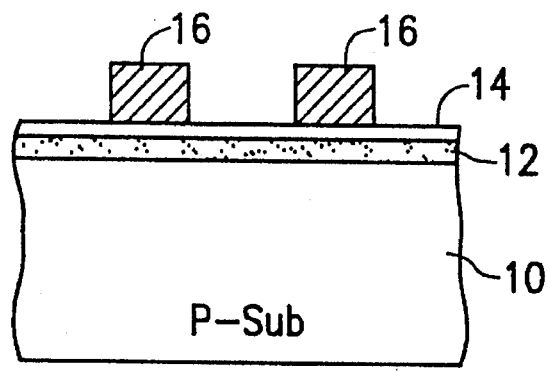
Figure 1C:
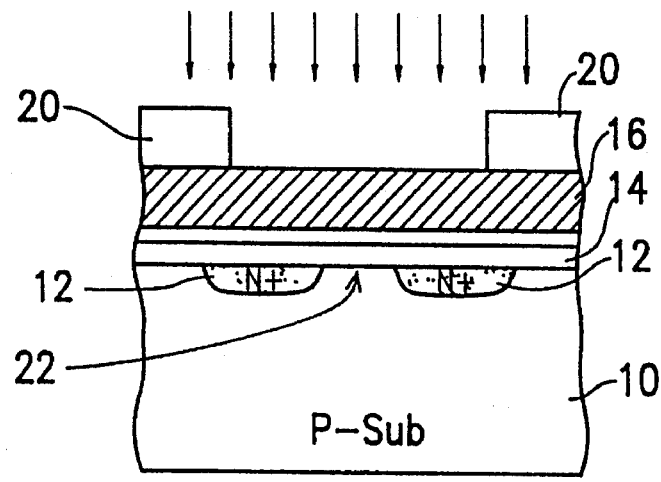
Figure 2:
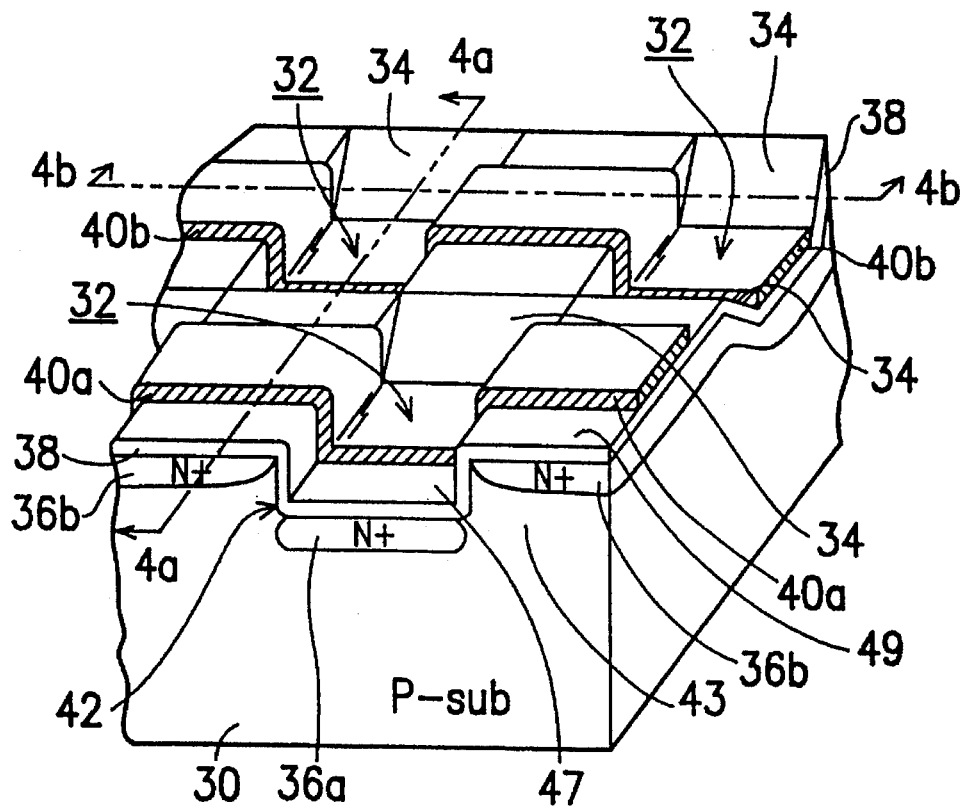
FIG. 2 is a perspective view of the memory cell configuration of a read-only memory device of a preferred embodiment in accordance with the present invention, wherein portions of the structure are removed to show the internal structural configuration in greater detail.
Figure 4A:
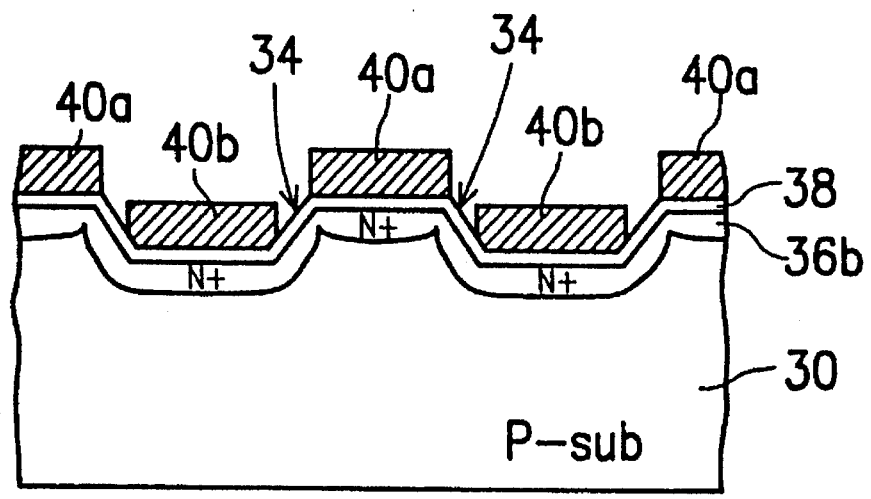
FIG. 4a shows the cross section of the memory cell configuration of the read-only memory device of FIG. 2 taken along the 4a—4a line.
Figure 4B:
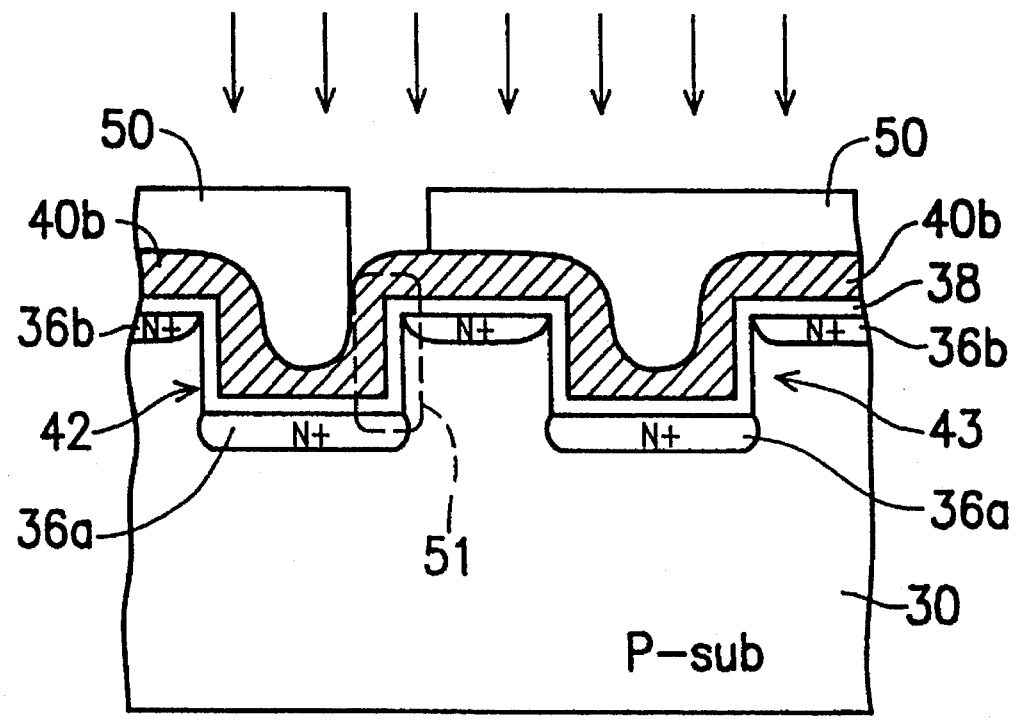
FIG. 4b shows the cross section of the memory cell configuration of the read-only memory device of FIG. 2 taken along the 4b—4b line.

A semiconductor substrate 30 (of P⁻ type material, for example) includes a major surface which is provided with interwoven trenches similar in arrangement to the quadrille pattern of the black and white squares of a "checker board" for example. A partial etching procedure, i.e., an anisotrophic crystal lattice, orientation-dependent wet etch, is utilized to obtain trenches 32 having opposing and sloping side walls 34, as shown in FIGS. 2 and 4a. Thereafter, an ion implantation procedure is utilized to implant ions (of N⁺type arsenic $As^{75}$ ions, for example) at an incident angle of 0° with respect to a direction vertical to the major surface or plane of the substrate (i.e, the plane seen in plan view), so as to form drain/source regions 36a and 36b. The walls 34 preferably slope, rather than being vertical, so that the ion implantation results in continuous bit lines for the drain/source regions 36a and 36b, as seen in FIG. 4a. The implantation energy level employed in this embodiment is approximately 80 KeV, and the dosage of implantation is approximately $3 \times 10^{15}$ atoms/cm². As such, the drain/source regions 36a and 36b are spaced from one another when they are separated by vertical walls 42, as can be seen in FIG. 4b.

As seen in FIG. 2, each trench 32 is etched into the major surface of silicon substrate 30 and includes sloping and opposing side walls 34 in the direction corresponding to section line 4a—4a. The drain/source regions 36a and 36b of the preferred memory cell construction are interwoven with respect to each other in high and low positions formed by the steep trenches 32. In the direction corresponding to section line 4b—4b, the side walls are preferably vertical. When a drain/source region 36a of a particular memory cell is positioned at a valley or trench bottom 47, the other drain/source region 36b of that cell is positioned on top of a mesa 49 adjacent the trench bottom 47 and separated from it by the aforementioned vertical wall. In this embodiment, the silicon substrate 30 is thus partitioned into a plurality of segments (like the quadrille pattern of the aforementioned squares of a chessboard) which substantially form a two-dimensional grid over the major surface. The two-dimensional grid is comprised of columns of segments parallel to a first axis (4a—4a) of the substrate 30 and rows of segments parallel to a second axis (4b—4b) of the substrate 30 which is substantially orthogonal to the first axis. The trenches 32 are located within predetermined segments. More specifically, the trenches 32 are alternately located within the segments of each column and within the segments of each row, thereby defining the trench bottoms 47 on the segments including one of the trenches 32 and defining the mesas 49 on the segments not including one of the trenches 32. The adjoining segments have sloping walls where the implanted material forms conductive lines and vertical walls where the implanted material forms source/drain structure on either side of a vertically arranged channel.

The above-described arrangement aligns the drain/source pairs 36a and 36b in high and low drain/source region positions relative to the plane of the silicon substrate for the entire device. The result is an arrangement wherein all drain/source regions 36a are in the low positions and all drain/source regions 36b are in the high positions. The spacing of the high and low drain/source positions relative to the major plane is selected depending upon the channel length desired (i.e., the bigger the channel desired, the larger the spacing).

Figure 3:
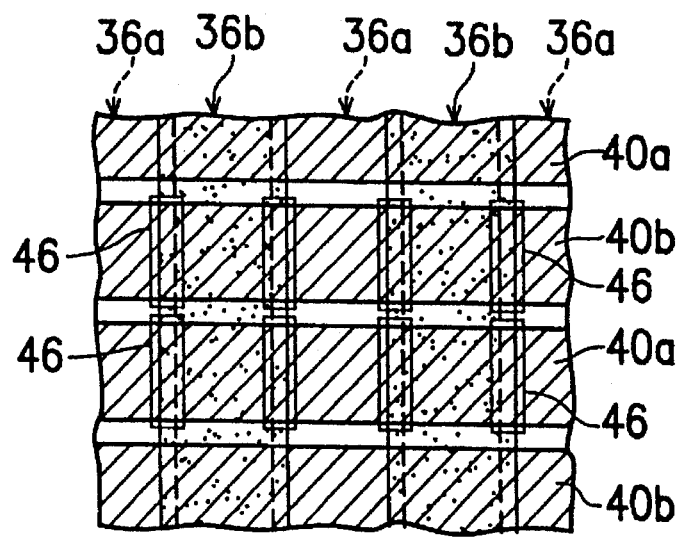
FIG. 3 is a top view of the memory cell configuration of the read-only memory device of FIG. 2.

A layer of gate oxide 38 is grown to a thickness of approximately 180 to 200 Å. A gate layer, such as silicide or polycide, is then deposited on the resulting substrate. Next, the gate layer is etched to define gate lines or regions 40a and 40b having widths comparable to that of the component width (such as is shown in FIG. 3). The preferred thickness of the gate regions is approximately 3,000 Å. As with the drain/source region pairs 36a, 36b, the gate regions 40a and 40b are also positioned at high and low gate region interwoven positions relative to the plane of the silicon substrate because of the presence of the trenches 32. See FIGS. 2 and 4b. For any pair of neighboring gate regions 40a, 40b, when one gate region is positioned on the trench bottom 47, its neighboring gate region is positioned on a neighboring mesa 49. The specific dimensions for the high and low gate region interweaving positions relative to the plane are proportionally changed to achieve the desired channel length.

In a memory cell fabricated in accordance with the preferred embodiment of the present invention, a drain/source channel 43 for the memory cell transistor occurs at the vertical side wall 42 between neighboring drain/source regions 36a and 36b, as can be seen in FIGS. 2 and 4b. Accordingly, the distance between transistor components 46 (indicated in FIG. 3 by the line border 46) in the direction section line 4b—4b is significantly reduced. Such a reduction is possible, although the actual surface length is magnified in the drawings for ease of illustration, because neighboring drain/source regions do not occur on the same plane, rather the channel 45 is vertically arranged as previously described. The aforedescribed memory cell configuration facilitates the fabrication of a ROM device having a 256M bit capacity in a wafer surface area which could only accommodate a 64M bit capacity prior art ROM device.

At this point in the fabrication process, the semifinished ROM device is ready to be programmed as shown in FIG. 4b. In accordance with the preferred embodiment, a photomask corresponding to the customer's programming requirements is utilized to configure the photoresist layer 50 and expose selected transistor memory cell regions that will be permanently shut off. For example, P⁻ type impurities may be implanted into the channels 43 through the polysilicon gate regions 40a or 40b by an ion implantation process into a region shown by dashed line 51, thereby preventing the channels 43 from conducting. The photoresist layer 50 is removed after this ion implantation procedure.

Preferably, the energy level employed in the above-described P⁻ type impurity implantation procedure is approximately 180 KeV, and the dosage is approximately $2 \times 10^{14}$ atoms/cm². As may be readily appreciated by persons skilled in the art, additional device fabrication procedures such as forming metal layers and a passivation layer are performed during fabrication of the final integrated circuit ROM memory device. Persons skilled in the art may similarly appreciate the fact that certain conditions, parameters, as well as materials utilized in the description of the present invention can be changed or modified without departing from the scope of the disclosure of the present invention. It therefore should he pointed out that the above description based on the described embodiment of the present invention only describes the invention and is not intended to limit the scope of the invention, which is defined in the claims below.

We claim:

1. A method for fabricating a semiconductor read-only memory device comprising the steps of:

(a) providing a substrate including a major surface;

(b) forming a plurality of trenches on said major surface such that said major surface has a plurality of mesas and valleys formed therein in a quadrille pattern with side walls connecting adjacent mesas and valleys;

(c) forming a plurality of drain/source regions on said substrate in pairs, one of said drain/source regions in each pair being located under a mesa and the other of said drain/source regions in each pair being located under an adjacent valley in a first direction along said major surface of said substrate at high and low drain/source region positions relative to a plane parallel to said major surface and said substrate, and forming a drain/source channel between each pair of neighboring drain/source regions;

(d) forming a gate oxide layer on said substrate; and (e) forming a plurality of gate regions on said gate oxide layer in a second direction along said major surface of said substrate, said second direction being orthogonal to said first direction, said gate regions overlying mesas and valleys in said quadrille pattern in said second direction.

2. The method of claim 1, wherein said step (b) includes forming said trenches with opposing and sloping side walls perpendicular to said first direction.

3. The method of claim 1, further comprising a step of:

(f) selectively implanting ions into said drain/source channels.

4. The method of claim 1, wherein said step (e) includes forming said gate regions from silicides with a gate region thickness of 3,000 Å.

5. The method of claim 1, wherein said step (e) includes forming said gate regions from polycides.

6. The method of claim 3, wherein said step (c) includes the step of implanting N+−type arsenic ions at a 0° incident angle with respect to a direction vertical to said major surface of said substrate, and wherein said step (f) includes the step of selectively implanting P-type ions into said drain/source channels.

7. The method of claim 6, wherein said step (c) includes employing an energy level for implanting said arsenic ions of 80 KeV at an arsenic ion dosage of $3\times10^{15}$ atoms/cm$^2$, and wherein said step (f) includes employing an energy level for implanting said P-type ions of approximately 180 KeV at a P-type ion dosage of $2\times10^{14}$ atoms/cm$^2$.

8. The method of claim 1, wherein said step (d) comprises forming said gate oxide layer with a gate oxide thickness of 180 to 200 Å.

9. The method of claim 3, further comprising the steps of forming metal layers and a passivation layer to said semiconductor read-only memory device.

* * * * *